US012052045B2

(12) United States Patent
Sijanec (10) Patent No.: US 12,052,045 B2
(45) Date of Patent: Jul. 30, 2024

(54) TRANSMISSION OF HIGH-FREQUENCY RADIO SIGNALS

(71) Applicant: California Internet, L.P., Ventura, CA (US)

(72) Inventor: Boris Sijanec, Maribor (SI)

(73) Assignee: GLOBTEL HOLDING D.O.O., Maribor (SI)

( * ) Notice: Subject to any disclaimer, the term of this patent is extended or adjusted under 35 U.S.C. 154(b) by 0 days.

(21) Appl. No.: 17/124,308

(22) Filed: Dec. 16, 2020

(65) Prior Publication Data

US 2022/0190867 A1 Jun. 16, 2022

(51) Int. Cl.
*H04B 1/40* (2015.01)
*H04L 7/033* (2006.01)
*H04L 12/28* (2006.01)
*H04W 88/08* (2009.01)
*H03L 7/08* (2006.01)

(52) U.S. Cl.
CPC ............. *H04B 1/40* (2013.01); *H04L 7/0331* (2013.01); *H04L 12/2801* (2013.01); *H03L 7/08* (2013.01); *H04W 88/08* (2013.01)

(58) Field of Classification Search
CPC ........ H01Q 3/40; H04B 1/0028; H04B 1/123; H04B 1/525; H04B 1/7107; H04L 5/14; H04L 5/1461
USPC .......... 455/69, 522, 63.1; 370/432; 375/376; 725/117
See application file for complete search history.

(56) References Cited

U.S. PATENT DOCUMENTS

| | | | | |
|---|---|---|---|---|
| 7,085,306 B1 * | 8/2006 | Voldman | ................ | H04B 1/715 348/E7.063 |
| 2002/0126685 A1 * | 9/2002 | Leatherbury | ...... | H04N 21/6168 370/432 |
| 2004/0068751 A1 * | 4/2004 | Basawapatna | ..... | H04N 7/17318 725/117 |
| 2007/0032256 A1 * | 2/2007 | Kolze | .................... | H04B 17/24 455/522 |
| 2011/0110415 A1 * | 5/2011 | Cooper | ............. | H04L 25/03006 375/232 |
| 2012/0201338 A1 * | 8/2012 | Leung | ..................... | H04L 27/20 375/376 |
| 2014/0094214 A1 * | 4/2014 | Meyer | .................. | H04W 52/46 455/522 |
| 2015/0146819 A1 * | 5/2015 | Chowdhury | .......... | H03F 1/3223 375/296 |

(Continued)

*Primary Examiner* — Tan H Trinh
(74) *Attorney, Agent, or Firm* — Armstrong Teasdale LLP (57) ABSTRACT

Provided are systems and methods for transmitting radio signals. A system for transmitting radio signals includes a base station and a customer premises equipment (CPE). The base station includes a first frequency converter and at least one first antenna. The first frequency converter is configured to receive a first radio signal having a predetermined frequency and convert the first radio signal into a second radio signal. The second radio signal has a frequency higher than the predetermined frequency. The at least one first antenna has a transmitter and is configured to wirelessly transmit, via the transmitter, the second radio signal to the CPE. The CPE includes at least one second antenna configured to receive the second radio signal from the at least one first antenna and a second frequency converter configured to convert the second radio signal into the first radio signal.

19 Claims, 6 Drawing Sheets

(56) References Cited

U.S. PATENT DOCUMENTS

| | | | |
|---|---|---|---|
| 2016/0028426 A1* | 1/2016 | Plevel | H04L 25/0204 |
| | | | 455/63.1 |
| 2017/0187406 A1* | 6/2017 | Talty | H04B 1/40 |
| 2017/0207507 A1* | 7/2017 | Shih | H01P 1/207 |
| 2019/0123442 A1* | 4/2019 | Vannucci | H01Q 3/40 |
| 2020/0252249 A1* | 8/2020 | Finkelstein | H04L 5/0007 |
| 2020/0366394 A1* | 11/2020 | Matter | H04H 20/79 |
| 2021/0099131 A1* | 4/2021 | Connell | H04B 1/0028 |
| 2021/0266933 A1* | 8/2021 | Hong | H04W 72/1263 |
| 2021/0297141 A1* | 9/2021 | Schafer | H04B 3/542 |

\* cited by examiner

```
┌─────────────────────────────────────────────────────────────────────┐
│   RECEIVE, VIA A FIRST FREQUENCY CONVERTER ASSOCIATED WITH A BASE   │
│ STATION, A FIRST RADIO SIGNAL HAVING A PREDETERMINED FREQUENCY, THE │
│    PREDETERMINED FREQUENCY BEING BASED ON A DATA OVER CABLE         │
│         SERVICE INTERFACE SPECIFICATIONS (DOCSIS) STANDARD          │
│                                 505                                 │
└─────────────────────────────────────────────────────────────────────┘
                                    │
┌─────────────────────────────────────────────────────────────────────┐
│ CONVERT, VIA THE FIRST FREQUENCY CONVERTER, THE FIRST RADIO SIGNAL  │
│   INTO A SECOND RADIO SIGNAL, THE SECOND RADIO SIGNAL HAVING A      │
│         FREQUENCY HIGHER THAN THE PREDETERMINED FREQUENCY           │
│                                 510                                 │
└─────────────────────────────────────────────────────────────────────┘
                                    │
┌─────────────────────────────────────────────────────────────────────┐
│      WIRELESSLY TRANSMIT, VIA A TRANSMITTER OF AT LEAST ONE FIRST   │
│ ANTENNA ASSOCIATED WITH THE BASE STATION, THE SECOND RADIO SIGNAL   │
│              TO A CUSTOMER PREMISES EQUIPMENT (CPE)                 │
│                                 515                                 │
└─────────────────────────────────────────────────────────────────────┘
                                    │
┌─────────────────────────────────────────────────────────────────────┐
│     RECEIVE, VIA A TRANSCEIVER OF AT LEAST ONE SECOND ANTENNA       │
│ ASSOCIATED WITH THE CPE, THE SECOND RADIO SIGNAL FROM THE AT LEAST  │
│                           ONE FIRST ANTENNA                         │
│                                 520                                 │
└─────────────────────────────────────────────────────────────────────┘
                                    │
┌─────────────────────────────────────────────────────────────────────┐
│  CONVERT, VIA A SECOND FREQUENCY CONVERTER ASSOCIATED WITH THE      │
│ CPE, THE SECOND RADIO SIGNAL INTO THE FIRST RADIO SIGNAL HAVING THE │
│                     PREDETERMINED FREQUENCY                         │
│                                 525                                 │
└─────────────────────────────────────────────────────────────────────┘
```

TRANSMISSION OF HIGH-FREQUENCY RADIO SIGNALS

TECHNICAL FIELD

This disclosure relates generally to data processing and, more particularly, to transmission of radio signals.

BACKGROUND

During conversion of radio signals to higher frequencies, the error rate multiplies rapidly if the resulting frequency is much higher than the original one. Thus, even a small inconsistency in the lower frequencies can become large error in higher frequencies. When the radio signal is converted using a standard Data over Cable Service Interface Specifications (DOCSIS) frequency to frequencies much lower than 80 gigahertz, these types of errors are insignificant. However, in case of conversion from the DOCSIS frequency to a frequency higher than 80 gigahertz, any small error on the transmission side can results in a significant error on the receiver side, with great loss of accuracy.

Another problem faced when transmitting the radio signals is movement of the pole on which an antenna and transceiver are installed as part of the customer premises equipment. The antenna may have the shape of an offset dish with the transceiver in front. Movement of the pole due to weather conditions (e.g., wind, rain) may cause displacement of the transceiver position with respect to the dish position. The displacement of the transceiver may cause degradation in the signal and distortions in data received by the customer premises equipment.

Furthermore, in some instances, the surface of a parabolic-shape offset dish antenna can be bent and deviate from the perfect parabolic shape. This may cause signal distortions.

SUMMARY

This summary is provided to introduce a selection of concepts in a simplified form that are further described in the Detailed Description below. This summary is not intended to identify key features or essential features of the claimed subject matter, nor is it intended to be used as an aid in determining the scope of the claimed subject matter.

Provided are systems and methods for transmitting radio signals. In some example embodiments, a system for transmitting radio signals may include a base station and a customer premises equipment (CPE). The base station may include a first frequency converter and at least one first antenna. The first frequency converter may be configured to receive a first radio signal having a predetermined frequency. The predetermined frequency may be based on standard Data over Cable Service Interface Specifications (DOCSIS). The first frequency converter may be further configured to convert the first radio signal into a second radio signal.

The second radio signal has a frequency higher than the predetermined frequency. During the conversion, the first frequency converter may use a phase lock loop (PLL) to control a phase of the second radio signal. The first frequency converter may be configured to minimize non-linear distortions of the second radio signal. The at least one first antenna may have a transmitter and may be configured to wirelessly transmit, via the transmitter, the second radio signal to the CPE. The CPE may include at least one second antenna and a second frequency converter. The at least one second antenna may have a transceiver configured to receive the second radio signal from the at least one first antenna. The second frequency converter may be configured to convert the second radio signal into the first radio signal having the predetermined frequency.

In some example embodiments, a method for transmitting radio signals may commence with receiving, via a first frequency converter associated with a base station, a first radio signal having a predetermined frequency based on a DOCSIS standard. The method may then continue with converting, via the first frequency converter, the first radio signal into a second radio signal. The second radio signal has a frequency higher than the predetermined frequency. During the conversion, the PLL can be used by the first frequency converter to control a phase of the second radio signal and non-linear distortions of the second radio signal can be minimized by the first frequency converter.

The method may further include wirelessly transmitting, via a transmitter of at least one first antenna associated with the base station, the second radio signal to a CPE. The method may continue with receiving, via a transceiver of at least one second antenna associated with the CPE, the second radio signal from the at least one first antenna. The method may further include converting, via a second frequency converter associated with the CPE, the second radio signal into the first radio signal having the predetermined frequency.

Additional objects, advantages, and novel features will be set forth in part in the detailed description section of this disclosure, which follows, and in part will become apparent to those skilled in the art upon examination of this specification and the accompanying drawings or may be learned by production or operation of the example embodiments. The objects and advantages of the concepts may be realized and attained by means of the methodologies, instrumentalities, and combinations particularly pointed out in the appended claims.

BRIEF DESCRIPTION OF THE DRAWINGS

Exemplary embodiments are illustrated by way of example and not limitation in the figures of the accompanying drawings, in which like references indicate similar elements.

DETAILED DESCRIPTION

The following detailed description includes references to the accompanying drawings, which form a part of the detailed description. The drawings show illustrations in accordance with exemplary embodiments. These exemplary embodiments, which are also referred to herein as "examples," are described in enough detail to enable those skilled in the art to practice the present subject matter. The embodiments can be combined, and other embodiments can be formed, by introducing structural and logical changes without departing from the scope of what is claimed. The following detailed description is, therefore, not to be taken in a limiting sense and the scope is defined by the appended claims and their equivalents.

In this document, the terms "a" or "an" are used, as is common in patent documents, to include one or more than one. In this document, the term "or" is used to refer to a nonexclusive "or," such that "A or B" includes "A but not B," "B but not A," and "A and B," unless otherwise indicated. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

Embodiments of the present disclosure are directed to conversion of a radio signal into a high-frequency radio signal and transmission of the high-frequency radio signal. As used herein, the term "high-frequency radio signal" means a radio signal having the frequency in the range of about 70 to about 80 gigahertz that is transmitted wirelessly between a base station and customer premises equipment (CPE). The frequency in the range of 70 to 80 gigahertz is within an Extremely High Frequency (EHF) band (30 to 300 gigahertz) according to the International Telecommunication Union (ITU) designation for bands of radio frequencies. As used herein, the frequency in the range of 70 to 80 gigahertz is referred to as "a transport frequency" used for transporting a radio signal between a base station and the CPE.

A system for transmitting high-frequency radio signal may include a base station and CPE. The base station may include a frequency converter and a plurality of antennas for data transmission. The base station may receive a radio signal having a predetermined frequency. The predetermined frequency may include frequency that is based on a DOCSIS standard. The DOCSIS standard is a telecommunications standard according to which high-bandwidth data transfer can be added to an existing cable television system. The DOCSIS 3.1 version supports the frequency of between 20 and 200 megahertz for a radio signal transmitted in an upstream direction (to a network operator) and the frequency of between 200 megahertz and 1.2 gigahertz for a radio signal transmitted in a downstream direction (to a client). According to the ITU designation, the frequencies supported by the DOCSIS standard are within a High Frequency (HF) band (between 3 and 30 megahertz), a Very High Frequency (VHF) band (from 30 to 300 megahertz), and an Ultra High Frequency (UHF) band (between 300 megahertz and 3 gigahertz).

Upon receipt of the radio signal having the predetermined frequency (i.e., the frequency based on the DOCSIS standard), the base station may convert, via the frequency converter, the radio signal into a radio signal that has a frequency higher than the predetermined frequency. For example, the predetermined DOCSIS frequency of the received radio signal may be between 200 megahertz and 1.2 gigahertz whereas, after the conversion, the resulting radio signal may have the frequency of 70 gigahertz. Thus, the frequency converter of the base station can convert the radio signal from a VHF/UHF radio signal supported by the DOCSIS standard into an EHF radio signal.

To avoid the error multiplication issue during the frequency conversion, the initial error on the base station (a transmission side) is kept as low as possible such that the initial error does not multiply and does not become a significant error on the CPE side (receiver side). The initial error on the transmission side is minimized by using, at the base station, the frequency converter that causes as few non-linear distortions as possible and, also, by using low-noise amplifiers.

Upon conversion of the radio signal, the base station wirelessly transmits the converted radio signal data having the frequency of 70 gigahertz to the CPE. The antennas of the base station may include sector antennas. A sector antenna is a directional microwave antenna with a sector-shaped pattern of signal radiation. A sector is a portion of the circumference of a circle measured in degrees of an arc, such as 60°, 90°, or 120°.

The CPE may include an antenna and a transceiver for receiving and transmitting the high-frequency radio signal. The CPE may further include a frequency converter for converting the radio signal. The CPE may receive, via the antenna and the transceiver, the radio signal data having the frequency of 70 gigahertz from the base station. Upon receipt of the radio signal by the antenna, the frequency converter of the CPE may convert the received radio signal into the radio signal having the predetermined DOCSIS frequency. Specifically, the frequency converter may convert the radio signal data having the frequency of 70 gigahertz into the radio signal having the predetermined frequency of between 200 megahertz and 1.2 gigahertz. Therefore, the frequency converter of the CPE converts the radio signal from an EHF radio signal into a VHF/UHF radio signal supported by the DOCSIS standard. The CPE may provide the converted radio signal having the predetermined DOCSIS frequency to a customer associated with the CPE.

The antenna of the CPE may include a parabolic antenna. To avoid the problem of degradation of a signal due to the displacement of the transceiver position with respect to the antenna position, a high-gain antenna similar to a point-to-point antenna, where the transceiver is positioned inside the antenna (i.e., not in front of the antenna), can be used on the CPE side.

Additionally, the antenna of the CPE may be configured to transmit the high-frequency radio signal to the base station. Specifically, a customer may request to transmit a radio signal to the base station. The CPE may receive, from the customer, the radio signal having a predetermined frequency. The predetermined frequency may be between 20 and 200 megahertz (according to the DOCSIS standard for a radio signal to be transmitted upstream). The frequency converter of the CPE may convert the radio signal having the predetermined frequency of between 20 and 200 megahertz into a radio signal having a transport frequency of 80 gigahertz. Thus, the frequency converter of the CPE converts the radio signal from an HF/VHF radio signal supported by the DOCSIS standard into an EHF radio signal. The antenna of the CPE may transmit, via the transceiver, the converted radio signal having the frequency of 80 gigahertz to the base station.

The base station may have a receiver associated with one of the antennas of the base station. The receiver may receive the radio signal having the frequency of 80 gigahertz from the CPE. The base station may use the frequency converter to convert the received radio signal into a radio signal having the predetermined frequency. Specifically, the frequency converter may convert the radio signal having the frequency of 80 gigahertz into the radio signal having the predetermined frequency of between 20 and 200 megahertz. Thus, the frequency converter of the base station converts the radio signal from an EHF radio signal into an HF/VHF radio signal supported by the DOCSIS standard. The base station may provide the converted radio signal having the predetermined DOCSIS frequency to a network operator associated with the base station.

Figure 1:
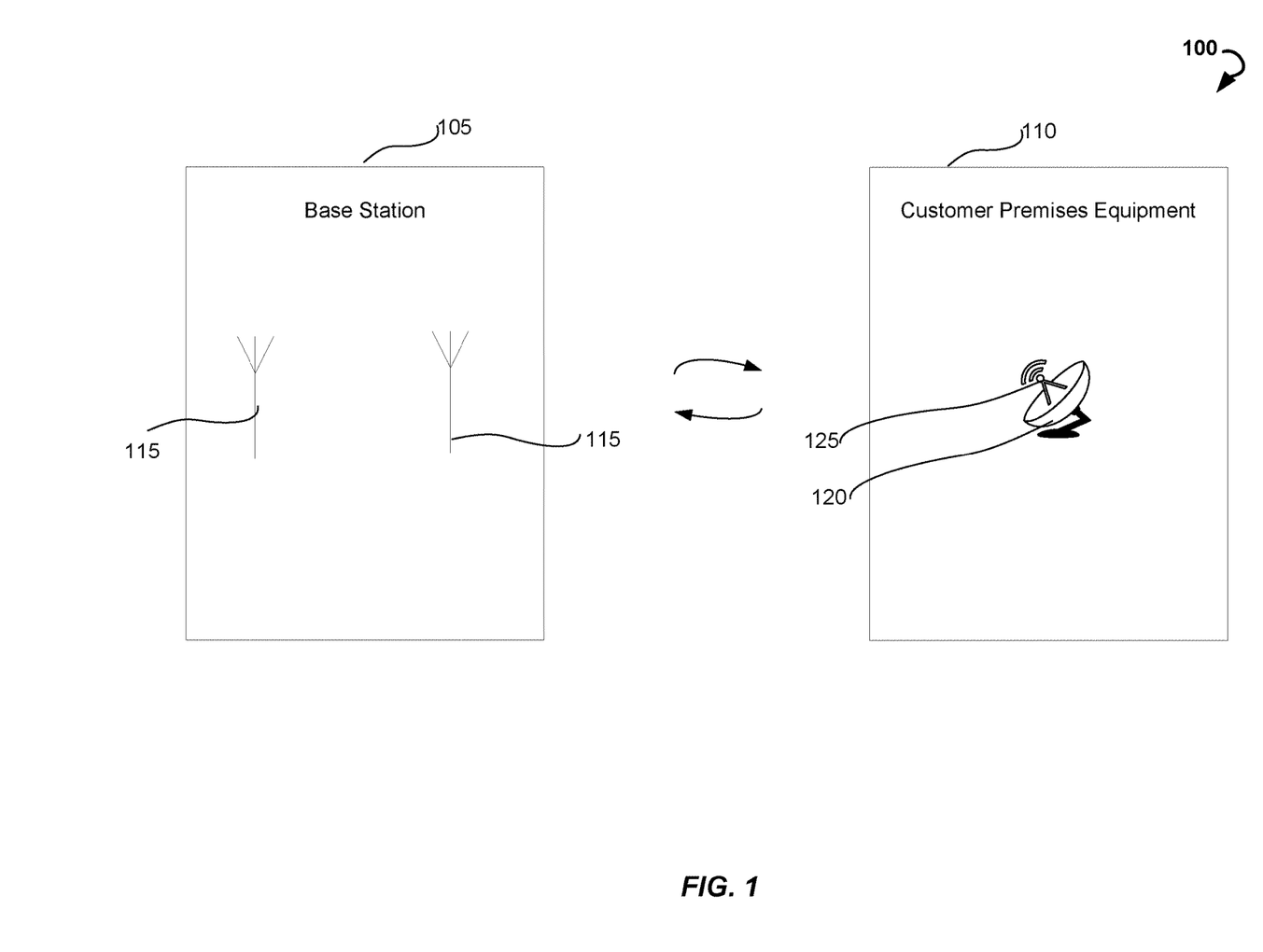
FIG. 1 illustrates an environment within which systems and methods for transmitting radio signals can be implemented, according to an example embodiment.

Referring now to the drawings, FIG. 1 is an environment 100 in which systems and methods for transmission of radio signals can be implemented. The environment 100 may include a base station 105 and a CPE 110. The base station 105 may receive a radio signal from a network operator (not shown). The base station 105 may have a plurality of antennas for transmission of the radio signal pre-processed by the base station 105 for the CPE 110. The antennas of the base station 105 are shown as sector antennas 115, which are directional microwave antennas with a sector-shaped pattern of signal radiation. A sector is a portion of the circumference of a circle measured in degrees of an arc, such as 60°, 90°, or 120°. The CPE 110 may have an antenna for receiving the radio signal from the base station 105. The antenna of the CPE 110 is shown as a parabolic antenna 120. The parabolic antenna 120 may have a transceiver 125 for receiving the radio signal from the base station 105. Upon receipt of the radio signal, the CPE 110 may provide the radio signal pre-processed by the CPE 110 to a customer (not shown) associated with the CPE 110.

Figure 2:
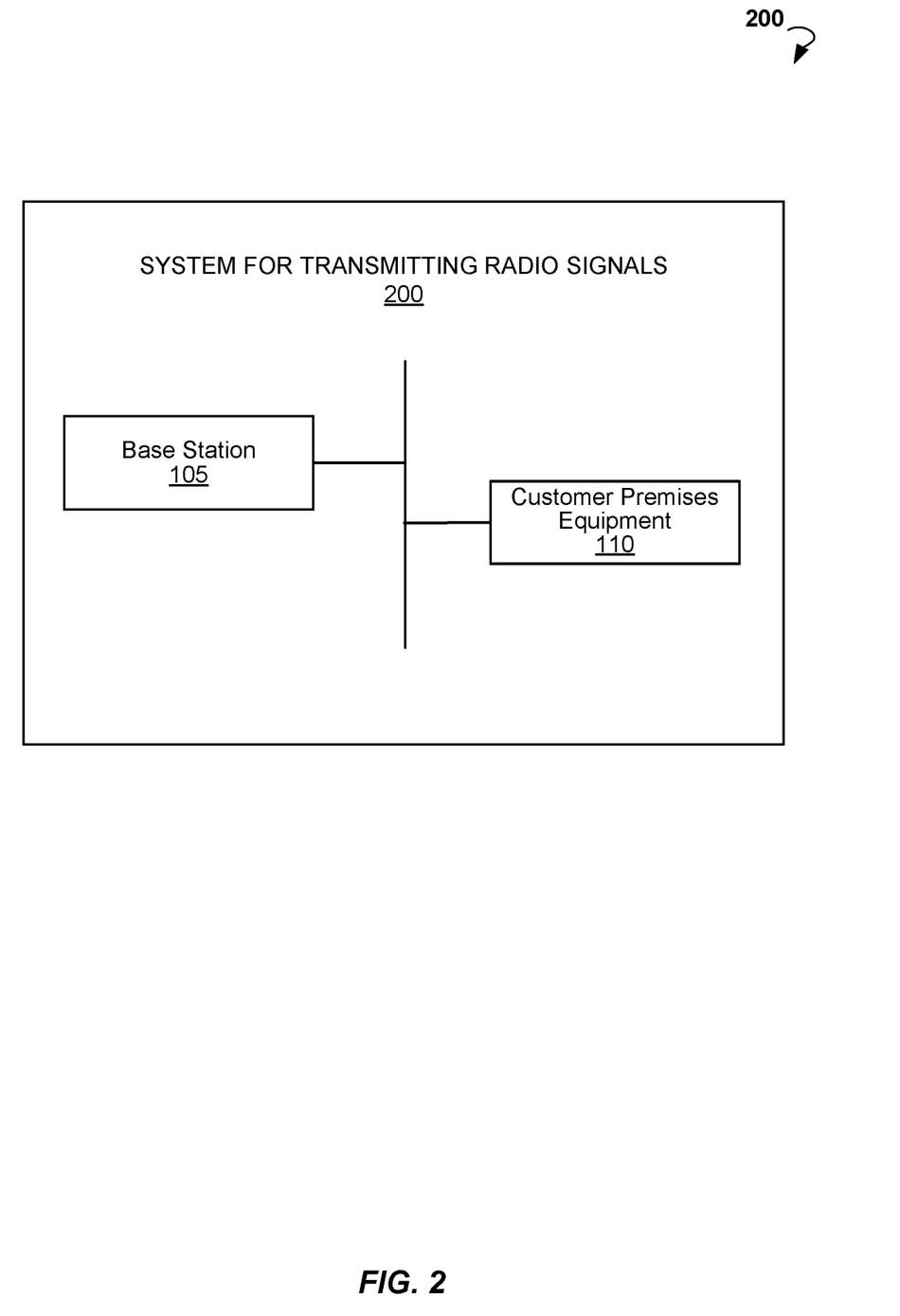
FIG. 2 is a block diagram illustrating a system for transmitting radio signals, according to an example embodiment.

FIG. 2 is a block diagram showing a system 200 for transmission of radio signals. The system 200 may include a base station 105 and a CPE 110. The structure of the base station 105 and the CPE 110 and the operations performed by the base station 105 and the CPE 110 are shown in detail with reference to FIGS. 3-5 below.

Figure 3:
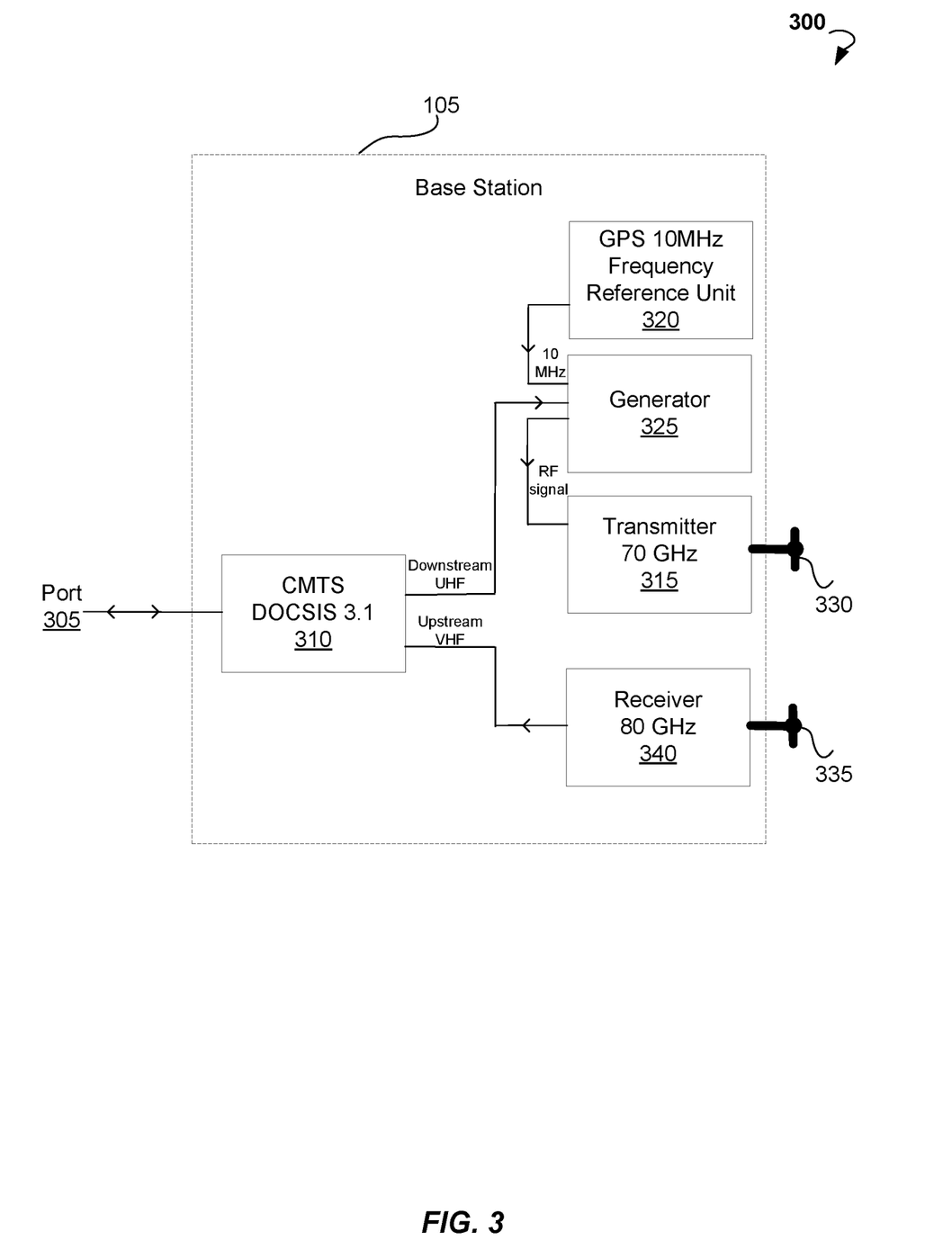
FIG. 3 is a schematic diagram showing a structure of a base station, according to an example embodiment.

FIG. 3 is a diagram 300 showing a structure of a base station 105, according to an example embodiment. The base station 105 may be connected to a port 205 for communicating radio signals to/from a network operator. The base station 105 may have a cable modem termination system (CMTS) 210. The CMTS 210 can support DOCSIS 3.1 version. The CMTS 210 can host downstream and upstream ports. The CMTS 210 can receive a radio signal from the network operator to be sent downstream. The radio signal may be an UHF radio signal having the frequency according to the DOCSIS standard.

The base station 105 may have a first frequency converter shown as a generator 325. The first frequency converter may receive the radio signal, also referred to as a first radio signal. Specifically, the first frequency converter may receive the radio signal from the CMTS 210. The first radio signal may have a predetermined frequency based on the DOCSIS standard. In an example embodiment, the first radio signal has the frequency of between 200 megahertz and 1.2 gigahertz. The first frequency converter may convert the first radio signal into a second radio signal. The second radio signal has a frequency higher than the predetermined frequency. In an example embodiment, the frequency of the second radio signal may be 70 gigahertz. Therefore, the first radio signal having the predetermined frequency of between 200 megahertz and 1.2 gigahertz is converted into the second radio signal having the transport frequency of about 70 gigahertz.

The DOCSIS standard requires an extremely low phase noise, especially in the upstream direction, therefore, the upstream direction is highly sensitive to errors. The first frequency converter can help achieving very high frequency modulations which were not possible with previous DOCSIS versions. In case of conversion of the radio signal from the DOCSIS frequency to 70 gigahertz frequency, any error in the radio signal multiplies such that any small error on the transmission side coverts into a significant error on the receiver side, and no frequency accuracy is achieved on the receiver side. To solve this problem, the initial error on the transmission side is kept as low as possible so that the error does not multiply and does not become a significant issue on the receiver side and does not impact the functionality of the CPE in general. Specifically, during the conversion, the first frequency converter of the base station may minimize non-linear distortions of the second radio signal. In an example embodiment, the first frequency converter may have a first integrated circuit (IC). The IC is an analog chip, in one example embodiment. In another example embodiment, to minimize non-linear distortions, the first frequency converter may have a low-noise amplifier and a pre-amplifier. The pre-amplifier may be configured to reduce errors before the signal is provided to the low-noise amplifier. In an example embodiment, the pre-amplifier is a low-noise pre-amplifier. The low-noise pre-amplifier may have a second IC. The distortions at the pre-amplifier can be minimized by a low-noise number and maximum possible output level on the amplifier output (high third-order intercept point (IP3)).

Additionally, during the conversion, the first frequency converter may use a phase lock loop (PLL) to control a phase of the second radio signal. The first frequency converter may have a PLL oscillator. The PLL oscillator may be configured to generate an output signal that has a phase related to the phase of an input signal.

Thus, during the conversion, the first frequency converter may cause as few non-linear distortions as possible (third-order Intermodulation distortion (IMD3), IP3), and the amplifier associated with the receiver of the base station may cause as low noise number as possible because the PLL oscillator may require as low phase noise as possible.

A frequency-division multiple access (FDMA) can be another factor presenting a significant challenge. To solve the FDMA-related problem, a diversity between a receiver and a transmitter which can be achieved with a 6-pole waveguide diplexer.

The base station 105 may further have at least one first antenna. The at least one first antenna may be a sector antenna shown as a sector antenna 330. In an example embodiment, the sector antenna 330 may have a 90-degree sector-shaped pattern of signal radiation. In a further example embodiment, the at least one first antenna may include three sector antennas 330. Each of the three sector antennas 330 may have a 30-degree sector-shaped pattern of signal radiation.

In an example embodiment, the at least one first antenna may further include at least one filter. The at least one filter may include a six-pole waveguide filter and configured to provide a high selectivity between a receiver and a transmitter in the frequency range and, hence, minimize errors during the conversion of the radio signal.

In an example embodiment, the filters may include band-pass filters configured to keep the frequency within a spectrum range that is allowed by authorities. For example, the filters may filter the radio signal to provide a radio signal in the 70.5 gigahertz to 71 gigahertz band spectrum range in one direction and in the 80 gigahertz to 81 gigahertz band spectrum range in another direction. The filters help to keep the signal within an unlicensed band. For example, if some part of the signal is in a licensed band, the filters may ensure that the frequency remains inside the unlicensed band.

In some example embodiments, other modifications of the elements of the base station include silverplating the filters, such as silverplating the passive chain of the filters for better conductivity.

The at least one first antenna may have a transmitter 315 and configured to transmit wirelessly, via the transmitter 315, the second radio signal to the CPE.

In an example embodiment, the base station 105 may further have a Global Positioning System (GPS) frequency reference unit 320 (10 MHz). The GPS frequency reference unit 320 may be suited for use in many applications including telecommunications and may be configured to provide a 10 MHz frequency reference. The GPS frequency reference unit 320 may provide the frequency reference to the first frequency converter.

Figure 4:
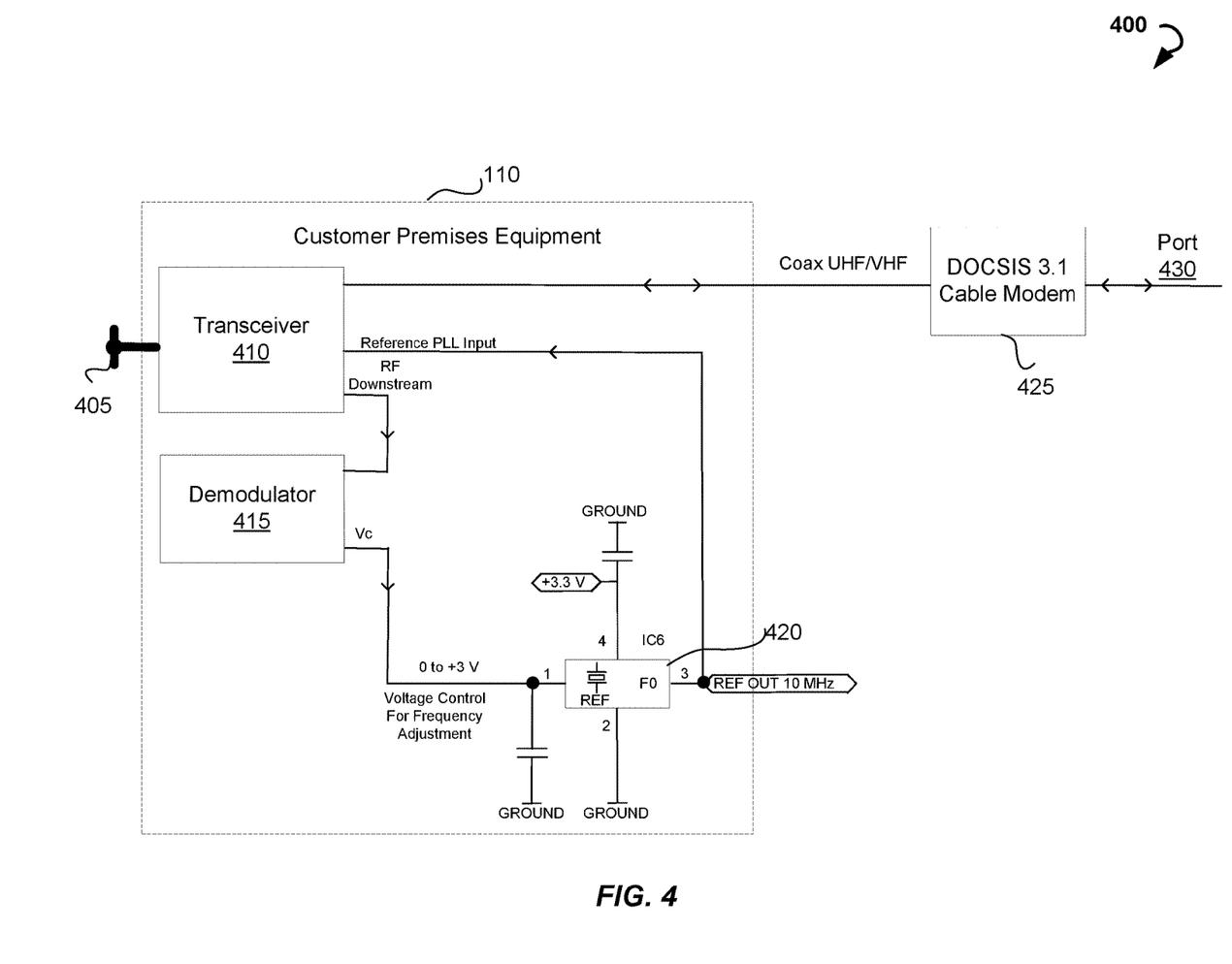
FIG. 4 is a schematic diagram showing a structure of a customer premises equipment, according to an example embodiment.

FIG. 4 is a block diagram 400 showing a structure of a CPE 110, according to an example embodiment. The CPE 110 may have at least one second antenna. In an example embodiment, the at least one second antenna is a parabolic antenna 405. The at least one second antenna may have a transceiver 410 configured to receive the second radio signal from the at least one first antenna of the base station 105 shown in FIG. 3. The CPE 110 may further have a second frequency converter shown as a demodulator 415. The transceiver 410 may receive the second radio signal from the parabolic antenna 405 and provide the second radio signal to the second frequency converter. The second frequency converter may be configured to convert the second radio signal into the first radio signal having the predetermined frequency. Specifically, the second frequency converter may convert the second radio signal data having the frequency of about 70 gigahertz into the first radio signal having the predetermined frequency of between 200 megahertz and 1.2 gigahertz (i.e., the predetermined frequency according to the DOCSIS).

In an example embodiment, upon the conversion, the second frequency converter may provide the data to the voltage control for the frequency adjustment. The CPE 110 may further have a temperature compensated crystal oscillator (TCXO) frequency reference unit 420 for stabilizing the frequency. The TCXO frequency reference unit 420 may provide the first radio signal to the transceiver 410, which, in turn, provides the first radio signal to a cable modem 425 operating under the DOCSIS 3.1 version standard. The cable modem 425 may provide the first radio signal to a port 430 for further relay of the signal to a customer associated with the CPE 110.

In an example embodiment, the customer may request sending a radio signal to the base station. Specifically, the CPE 110 may receive the radio signal in the form of a first radio signal having the predetermined frequency. In particular, the predetermined frequency of the first radio signal intended to be sent upstream may be between 20 and 200 megahertz (according to the DOCSIS standard for a radio signal to be transmitted in an upstream direction). The second frequency converter may be configured to convert the first radio signal into a third radio signal. The third radio signal may be of higher frequency than the predetermined frequency. In an example embodiment, the frequency of the third radio signal is about 80 gigahertz. Specifically, the second frequency converter of the CPE 110 may convert the first radio signal having the predetermined frequency between 20 and 200 megahertz into the second radio signal having a transport frequency of 80 gigahertz. The CPE 110 may be configured to transmit, via the transceiver 410, the third radio signal to the base station.

The at least one second antenna of the CPE 110 may have the form of an offset dish with the transceiver 410 disposed in front of the offset dish. The movements of the pole on which the at least one second antenna and the transceiver 410 are installed due to weather conditions may cause displacement of the transceiver position with respect to the dish position. To eliminate this problem and avoid degradation of the signal, a high-gain antenna similar to a point-to-point antenna (where the transceiver is inside the antenna as opposed to being in front) can be used on the CPE side. Thus, the transceiver 410 may be located inside the at least one second antenna of the CPE 110.

A surface of some offset dishes can deviate from a perfect parabolic shape, which may cause signal distortions. To determine whether the shape of the antenna has no abnormalities, a quality control testing mechanism may be used. The testing mechanism may include a testing plant that simulates the conditions of normal antenna operations. The testing plant may, for example, heat the transceiver of the antenna, cool the transceiver, and simulate other possible environment conditions. Based on the data collected during the simulation, the testing plant may determine whether the antenna has passed the test and can be installed on the CPE.

Referring again to FIG. 3, the base station 105 may further include at least one third antenna. In an example embodiment, the at least one third antenna may include a sector antenna 335. In an example embodiment, the sector antenna 335 may have a 90-degree sector-shaped pattern of signal radiation. In a further example embodiment, the at least one third antenna may include three sector antennas 335. Each of the three sector antennas 335 may have a 30-degree sector-shaped pattern of signal radiation.

Thus, in an example embodiment, the base station may have two antennas inside a sector, namely one upstream sector antenna and one downstream sector antenna, each having a 90-degree sector-shaped pattern of signal radiation. In a further example embodiment, instead of using two antennas that cover 90 degrees in each direction, three antennas that cover 30 degrees in each direction can be used, such that three sector antennas are provided in the upstream direction and three sector antennas are provided in the downstream direction. Because the beam provided by the 30-degree sector antennas is narrower, there can be more antenna gain on the sector antenna. Therefore, a better signal-to-noise ratio is provided on the CPE side. The three sector antennas that cover 30 degrees in each direction have the antenna gain needed on the upstream to achieve 1 to 8 frequency modulation.

The at least one third antenna may have a receiver 340 and may be configured to receive, via the receiver 340, the third radio signal from the CPE. Upon receipt of the third radio signal, the third radio signal may be provided to the first frequency converter of the base station 105. The first frequency converter may be configured to convert the third radio signal into the first radio signal. Specifically, the first frequency converter of the base station 105 may convert the second radio signal having a transport frequency of about 80 gigahertz into the first radio signal having the predetermined frequency between 20 and 200 megahertz. Upon conversion, the first radio signal may be provided to the CMTS 310 for relay to the network operator.

Thus, the base station 105 may have a receiving part and a transmission part. The receiving part may include the sector antenna 330 (e.g., a sector horn antenna) for receiving the radio signal having the frequency of 80 GHz. The base station 105 may further include a six-pole waveguide receiver filter working with 80 GHz frequency, a low-noise amplifier associated with a receiver (RX) that works with 80 GHz frequency, and a frequency mixer IF1 (1-1.5 GHz) (a digital input adapter (DIA) hybrid) with wire bonding and a power supply printed circuit board (PCB). The receiving part may further include a low phase noise PLL for the frequency mixer (80 GHz), the frequency converter from intermediate frequency (IF) 1 to IF2 (20-120 MHz) with a mixer and a PLL, and a low phase noise PLL for the IF frequency mixer.

The transmission part of the base station 105 may have a frequency converter from IF1 (DOCSIS) to IF2 (1-1.5 GHz) with a frequency mixer and PLL, a low phase noise PLL for the IF frequency mixer (70 GHz), a transmitter (TX) IF2 (1-1.5 GHz), a frequency mixer to an amplifier (out 70 GHz, DIA hybrid), with wire bonding and a power supply PCB, a low phase noise PLL for the frequency mixer (70 GHz), a 5-pole waveguide transmitter (TX) filter (70 GHz), a solid state power amplifier (an output power amplifier) (70 GHz), and the sector antenna 335 (a sector horn antenna) (70 GHz).

Similarly, the CPE 110 may have a receiving part and a transmission part. The transmission part may include a frequency converter from IF1 (DOCSIS) to IF2 (2-2.1 GHz) with a frequency mixer and PLL, a low phase noise PLL for the IF frequency mixer (80 GHz), a transmitter (TX) IF2 (2-2.1 GHz), a mixer to an amplifier (out 80 GHz, DIA hybrid) with wire bonding and a power supply PCB, a low phase noise PLL for the frequency mixer (80 GHz), 5-pole waveguide TX/RX diplexer (80 GHz).

The receiving part of the CPE 110 may include a 5-pole waveguide RX/TX diplexer (70 GHz), a low-noise amplifier associated with a receiver (RX), a frequency mixer (0.5-1 GHz, DIA hybrid) with wire bonding and a power supply PCB, a low phase noise PLL with a mixer (70 GHz), and an IF UHF-band amplifier with a RX/TX LC diplexer.

Figure 5:
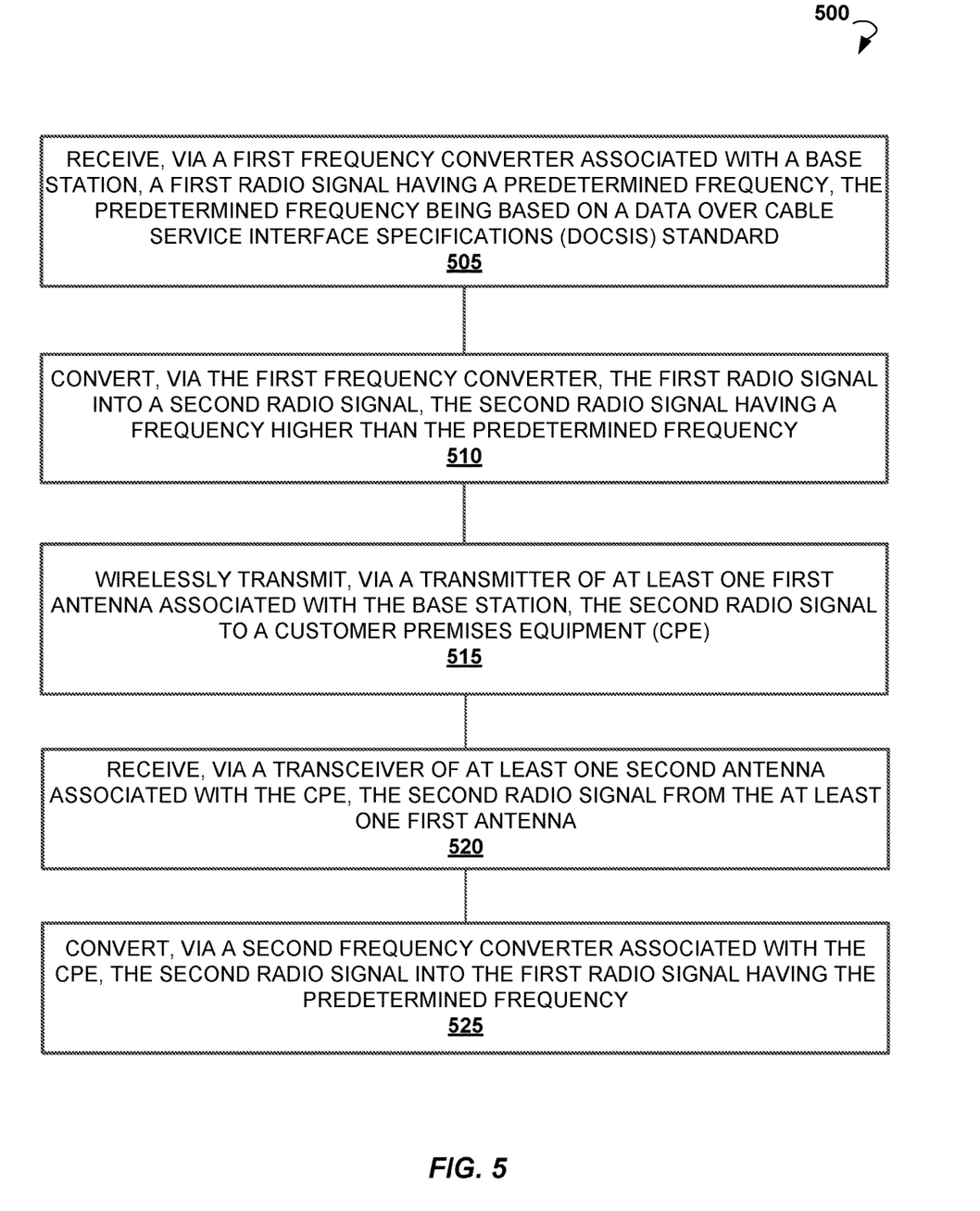
FIG. 5 is a flow diagram illustrating a method for transmitting radio signals, according to an example embodiment.

FIG. 5 is a flow chart of a method 500 for transmitting radio signals, according to one example embodiment. The method 505 may commence with receiving, via a first frequency converter associated with a base station, a first radio signal having a predetermined frequency at operation 505. The predetermined frequency may be based on a DOCSIS standard. The method 500 may continue with converting, via the first frequency converter, the first radio signal into a second radio signal at operation 510. The second radio signal may have a frequency higher than the predetermined frequency. In an example embodiment, the frequency of the second radio signal is about 70 gigahertz. During the conversion, the first frequency converter may use a PLL to control a phase of the second radio signal. Furthermore, the first frequency converter may minimize non-linear distortions of the second radio signal. The method 500 may continue with operation 515, at which the second radio signal is wirelessly transmitted, via a transmitter of at least one first antenna associated with the base station, to a CPE.

At operation 520, the second radio signal may be received from the at least one first antenna via a transceiver of at least one second antenna associated with the CPE. The method 500 may continue with converting, via a second frequency converter associated with the CPE, the second radio signal into the first radio signal having the predetermined frequency at operation 525.

In an example embodiment, the method 500 may further include converting, by the second frequency converter, the first radio signal into a third radio signal. The third radio signal may have a frequency higher than the predetermined frequency. In an example embodiment, the frequency of the second radio signal is about 80 gigahertz. The method 500 may continue with transmitting, by the transceiver associated with the CPE, the third radio signal to the base station. The method 500 may further include receiving, by a receiver of at least one third antenna associated with the base station, the third radio signal from the CPE. The first frequency converter of the base station may convert the third radio signal into the first radio signal.

In an example embodiment, the antennas of the base station, i.e., each of the at least one first antenna and the at least one third antenna, may be a sector antenna having a 90-degree sector-shaped pattern of signal radiation. In a further example embodiment, each of the at least one first antenna and the at least one third antenna may include three sector antennas having a 30-degree sector-shaped pattern of signal radiation.

Figure 6:
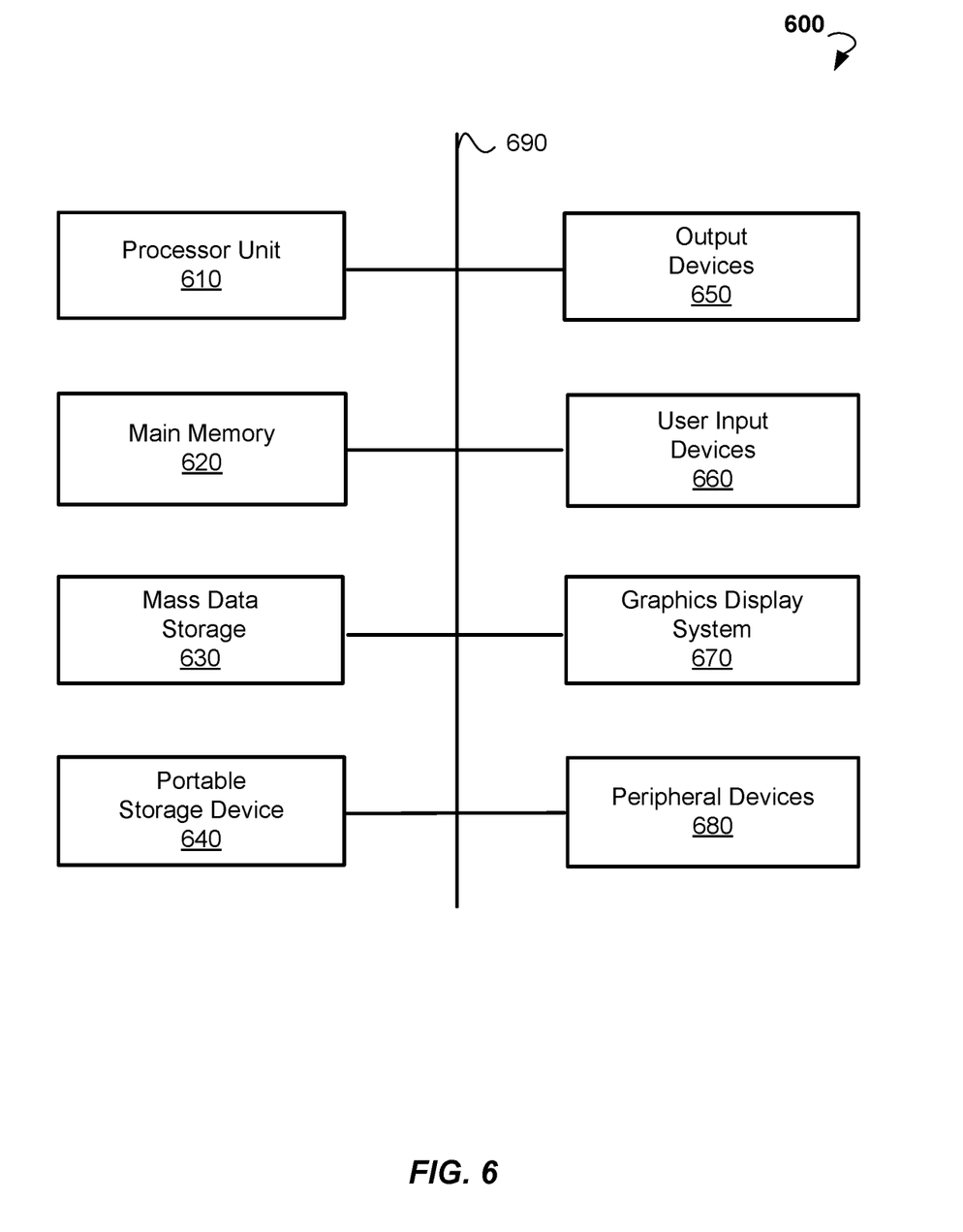
FIG. 6 is a computing system that can be used to implement a method for using multi-faceted trust scores in data security, according to an example embodiment.

FIG. 6 illustrates an exemplary computer system 600 that may be used to implement some embodiments of the present invention. The computer system 600 of FIG. 6 may be implemented in the contexts of the likes of computing systems, networks, servers, or combinations thereof. The computer system 600 of FIG. 6 includes one or more processor units 610 and main memory 620. Main memory 620 stores, in part, instructions and data for execution by processor units 610. Main memory 620 stores the executable code when in operation, in this example. The computer system 600 of FIG. 6 further includes a mass data storage 630, portable storage device 640, output devices 650, user input devices 660, a graphics display system 670, and peripheral devices 680.

The components shown in FIG. 6 are depicted as being connected via a single bus 690. The components may be connected through one or more data transport means. Processor unit 610 and main memory 620 is connected via a local microprocessor bus, and the mass data storage 630, peripheral device(s) 680, portable storage device 640, and graphics display system 670 are connected via one or more input/output (I/O) buses.

Mass data storage 630, which can be implemented with a magnetic disk drive, solid state drive, or an optical disk drive, is a non-volatile storage device for storing data and instructions for use by processor unit 610. Mass data storage 630 stores the system software for implementing embodiments of the present disclosure for purposes of loading that software into main memory 620.

Portable storage device 640 operates in conjunction with a portable non-volatile storage medium, such as a flash drive, floppy disk, compact disk, digital video disc, or Universal Serial Bus (USB) storage device, to input and output data and code to and from the computer system 600 of FIG. 6. The system software for implementing embodiments of the present disclosure is stored on such a portable medium and input to the computer system 600 via the portable storage device 640.

User input devices 660 can provide a portion of a user interface. User input devices 660 may include one or more microphones, an alphanumeric keypad, such as a keyboard, for inputting alphanumeric and other information, or a pointing device, such as a mouse, a trackball, stylus, or cursor direction keys. User input devices 660 can also include a touchscreen. Additionally, the computer system 600 as shown in FIG. 6 includes output devices 650. Suitable output devices 650 include speakers, printers, network interfaces, and monitors.

Graphics display system 670 include a liquid crystal display (LCD) or other suitable display device. Graphics display system 670 is configurable to receive textual and graphical information and processes the information for output to the display device.

Peripheral devices 680 may include any type of computer support device to add additional functionality to the computer system.

The components provided in the computer system 600 of FIG. 6 are those typically found in computer systems that may be suitable for use with embodiments of the present disclosure and are intended to represent a broad category of such computer components that are well known in the art. Thus, the computer system 600 of FIG. 6 can be a personal computer (PC), handheld computer system, telephone, mobile computer system, workstation, tablet, phablet, mobile phone, server, minicomputer, mainframe computer, wearable device, an Internet-of-things (IOT) device/system, or any other computer system. The computer may also include different bus configurations, networked platforms, multi-processor platforms, and the like. Various operating systems may be used including UNIX, LINUX, WINDOWS, MAC OS, PALM OS, QNX ANDROID, IOS, CHROME, and other suitable operating systems.

The processing for various embodiments may be implemented in software that is cloud-based. In some embodiments, the computer system 600 is implemented as a cloud-based computing environment, such as a virtual machine operating within a computing cloud. In other embodiments, the computer system 600 may itself include a cloud-based computing environment, where the functionalities of the computer system 600 are executed in a distributed fashion. Thus, the computer system 600, when configured as a computing cloud, may include pluralities of computing devices in various forms, as will be described in greater detail below.

In general, a cloud-based computing environment is a resource that typically combines the computational power of a large grouping of processors (such as within web servers) and/or that combines the storage capacity of a large grouping of computer memories or storage devices. Systems that provide cloud-based resources may be utilized exclusively by their owners or such systems may be accessible to outside users who deploy applications within the computing infrastructure to obtain the benefit of large computational or storage resources.

The cloud may be formed, for example, by a network of web servers that comprise a plurality of computing devices, such as the computer system 600, with each server (or at least a plurality thereof) providing processor and/or storage resources. These servers may manage workloads provided by multiple users (e.g., cloud resource customers or other users). Typically, each user places workload demands upon the cloud that vary in real-time, sometimes dramatically. The nature and extent of these variations typically depends on the type of business associated with the user.

Thus, various embodiments of methods and systems for transmitting radio signals have been described. Although embodiments have been described with reference to specific example embodiments, it will be evident that various modifications and changes can be made to these example embodiments without departing from the broader spirit and scope of the present application. Accordingly, the specification and drawings are to be regarded in an illustrative rather than a restrictive sense. There are many alternative ways of implementing the present technology. The disclosed examples are illustrative and not restrictive.

The invention claimed is:

1. A system for transmitting radio signals, the system comprising:
a base station, the base station comprising:
a first frequency converter configured to:
receive a first radio signal having a predetermined frequency, the predetermined frequency being based on a Data over Cable Service Interface Specifications (DOCSIS) standard;
convert the first radio signal into a second radio signal, the second radio signal having a frequency higher than the predetermined frequency, wherein during the conversion:
a phase lock loop (PLL) is used to control a phase of the second radio signal;
a low-noise pre-amplifier is used to reduce errors and provide the signal to a low-noise amplifier; and
the low-noise amplifier is used to minimize non-linear distortions of the second radio signal;
at least one first antenna, the at least one first antenna having a transmitter and being configured to wirelessly transmit, via the transmitter, the second radio signal to a customer premises equipment (CPE); and
the CPE, the CPE comprising:
at least one second antenna, the at least one second antenna having a transceiver configured to receive the second radio signal from the at least one first antenna; and
a second frequency converter configured to convert the second radio signal into the first radio signal having the predetermined frequency.

2. The system of claim 1, wherein the transceiver is located inside the at least one second antenna.

3. The system of claim 1, wherein the at least one first antenna includes a sector antenna, the sector antenna having a 90-degree sector-shaped pattern of signal radiation.

4. The system of claim 1, wherein the at least one first antenna includes three sector antennas, each of the three sector antennas having a 30-degree sector-shaped pattern of signal radiation.

5. The system of claim 1, wherein the at least one first antenna includes at least one filter, wherein the at least one filter includes a six-pole waveguide filter.

6. The system of claim 1, wherein the frequency of the second radio signal is about 70 gigahertz.

7. The system of claim 1, wherein the second frequency converter is further configured to convert the first radio signal into a third radio signal, the third radio signal having a frequency higher than the predetermined frequency.

8. The system of claim 7, wherein the frequency of the third radio signal is about 80 gigahertz.

9. The system of claim 7, wherein the CPE is further configured to transmit, via the transceiver, the third radio signal to the base station.

10. The system of claim 9, wherein the base station further comprises at least one third antenna having a receiver, the at least one third antenna being configured to receive, via the receiver, the third radio signal from the CPE.

11. The system of claim 10, wherein the first frequency converter is further configured to convert the third radio signal into the first radio signal.

12. A method for transmitting radio signals, the method comprising:
receiving, via a first frequency converter associated with a base station, a first radio signal having a predetermined frequency, the predetermined frequency being based on a Data over Cable Service Interface Specifications (DOCSIS) standard;

converting, via the first frequency converter, the first radio signal into a second radio signal, the second radio signal having a frequency higher than the predetermined frequency, wherein during the conversion:

a phase lock loop (PLL) is used by the first frequency converter to control a phase of the second radio signal;

a low-noise pre-amplifier is used by the first frequency converter to reduce errors and provide the signal to a low-noise amplifier; and the low-noise amplifier is used by the first frequency converter to minimize non-linear distortions of the second radio signal;

wirelessly transmitting, via a transmitter of at least one first antenna associated with the base station, the second radio signal to a customer premises equipment (CPE);

receiving, via a transceiver of at least one second antenna associated with the CPE, the second radio signal from the at least one first antenna; and converting, via a second frequency converter associated with the CPE, the second radio signal into the first radio signal having the predetermined frequency.

13. The method of claim 12, wherein the frequency of the second radio signal is about 70 gigahertz.

14. The method of claim 12, further comprising converting, by the second frequency converter, the first radio signal into a third radio signal, the third radio signal having a frequency higher than the predetermined frequency.

15. The method of claim 14, wherein the frequency of the third radio signal is about 80 gigahertz.

16. The method of claim 14, further comprising transmitting, by the transceiver associated with the CPE, the third radio signal to the base station.

17. The method of claim 14, further comprising receiving, by a receiver of at least one third antenna associated with the base station, the third radio signal from the CPE; and converting, by the first frequency converter, the third radio signal into the first radio signal.

18. The method of claim 17, wherein each of the at least one first antenna and the at least one third antenna includes one of the following:

a sector antenna, the sector antenna having a 90-degree sector-shaped pattern of signal radiation; and three sector antennas, each of the three sector antennas having a 30-degree sector-shaped pattern of signal radiation.

19. A system for transmitting radio signals, the system comprising:

a base station, the base station comprising:

a first frequency converter configured to:

receive a first radio signal having a predetermined frequency, the predetermined frequency being based on a Data over Cable Service Interface Specifications (DOCSIS) standard; and convert the first radio signal into a second radio signal, the second radio signal having a frequency higher than the predetermined frequency, wherein the frequency of the second radio signal is about 70 gigahertz, wherein during the conversion:

a phase lock loop (PLL) is used to control a phase of the second radio signal;

a low-noise pre-amplifier is used to reduce errors and provide the signal to a low-noise amplifier; and the low-noise amplifier is used to minimize non-linear distortions of the second radio signal; and at least one first antenna, the at least one first antenna having a transmitter and being configured to wirelessly transmit, via the transmitter, the second radio signal to a customer premises equipment (CPE), wherein the at least one first antenna includes three sector antennas, each of the three sector antennas having a 30-degree sector-shaped pattern of signal radiation; and the CPE, the CPE comprising:

at least one second antenna, the at least one second antenna having a transceiver configured to receive the second radio signal from the at least one first antenna; and a second frequency converter configured to:

convert the second radio signal into the first radio signal having the predetermined frequency; and convert the first radio signal into a third radio signal to be transmitted to the base station, the third radio signal having a frequency higher than the predetermined frequency, wherein the frequency of the third radio signal is about 80 gigahertz.

* * * * *